(12) United States Patent
Carlo et al.

(10) Patent No.: US 9,772,383 B2
(45) Date of Patent: Sep. 26, 2017

(54) BATTERY TEST REPORT SYSTEM AND METHOD

(71) Applicant: Johnson Controls Technology Company, Holland, MI (US)

(72) Inventors: Michael R. Carlo, Sussex, WI (US); Dale A. Gospodarek, Kenosha, WI (US)

(73) Assignee: Johnson Controls Technology Company, Holland, MI (US)

( * ) Notice: Subject to any disclaimer, the term of this patent is extended or adjusted under 35 U.S.C. 154(b) by 0 days.

(21) Appl. No.: 15/013,800

(22) Filed: Feb. 2, 2016

(65) Prior Publication Data

US 2016/0259015 A1    Sep. 8, 2016

Related U.S. Application Data

(60) Provisional application No. 62/128,375, filed on Mar. 4, 2015.

(51) Int. Cl.
| | |
|---|---|
| *G08B 21/00* | (2006.01) |
| *G01R 31/36* | (2006.01) |
| *B60L 11/18* | (2006.01) |
| *G01R 31/00* | (2006.01) |

(52) U.S. Cl.
CPC ......... *G01R 31/3689* (2013.01); *B60L 11/18* (2013.01); *G01R 31/3606* (2013.01); *G01R 31/007* (2013.01); *G01R 31/3679* (2013.01); *Y02T 10/7005* (2013.01)

(58) Field of Classification Search
CPC . G01R 31/3689; G01R 31/3606; B60L 11/18; H02J 7/0021

USPC ..................................................... 340/636.1
See application file for complete search history.

(56) References Cited

U.S. PATENT DOCUMENTS

| | | | |
|---|---|---|---|
| 4,855,770 A | 8/1989 | Mauchan et al. | |
| 6,051,976 A | 4/2000 | Bertness | |
| 6,842,707 B2 | 1/2005 | Raichle et al. | |
| 6,871,151 B2 | 3/2005 | Bertness | |
| 6,885,307 B2 | 4/2005 | Lockhart et al. | |
| 7,750,639 B2 | 7/2010 | Quint et al. | |
| 8,117,049 B2 * | 2/2012 | Berkobin ............... | G06Q 40/08 340/500 |
| 8,344,685 B2 | 1/2013 | Bertness et al. | |
| 2005/0206346 A1 | 9/2005 | Smith et al. | |
| 2005/0234663 A1 * | 10/2005 | Quint .................... | G06F 19/00 702/63 |

(Continued)

FOREIGN PATENT DOCUMENTS

KR    20130008701    1/2013

OTHER PUBLICATIONS

PCT/US2016/018434 International Search Report and Written Opinion dated Jul. 13, 2016.

*Primary Examiner* — Kerri McNally
(74) *Attorney, Agent, or Firm* — Fletcher Yoder, P.C.

(57) ABSTRACT

A system a vehicle battery tester configured to test at least one condition of a vehicle battery and to transmit battery condition information relating to the at least one condition of the vehicle battery to a server. The system also includes the server, which is configured to receive the battery condition information from the vehicle battery tester and to transmit, to a consumer, a report generated based at least in part on the battery condition information.

17 Claims, 4 Drawing Sheets

(56) References Cited

U.S. PATENT DOCUMENTS

| | | | |
|---|---|---|---|
| 2009/0198372 A1* | 8/2009 | Hammerslag | B60L 11/1822 700/226 |
| 2011/0187377 A1 | 8/2011 | Boysen et al. | |
| 2014/0097937 A1* | 4/2014 | Gercekci | G08C 17/02 340/5.61 |
| 2014/0225724 A1* | 8/2014 | Rankin | G06F 3/048 340/438 |
| 2014/0229129 A1 | 8/2014 | Campbell et al. | |
| 2014/0340231 A1 | 11/2014 | Stukenberg et al. | |
| 2015/0046106 A1 | 2/2015 | Wade et al. | |
| 2016/0039291 A1* | 2/2016 | Reese | B60L 3/12 701/29.3 |

* cited by examiner

BATTERY TEST REPORT SYSTEM AND METHOD

CROSS REFERENCE TO RELATED APPLICATIONS

This application claims priority from and the benefit of U.S. Provisional Application Ser. No. 62/128,375, entitled "CONSUMER BATTERY TESTER REPORT NOTIFICATION SYSTEM", filed Mar. 4, 2015, which is hereby incorporated by reference for all purposes.

BACKGROUND

The disclosure relates generally to the field of batteries and battery testers. More specifically, the present disclosure relates to a battery tester report notification system and method.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

It may be desirable to test batteries to determine a condition (e.g., a health) of a tested battery. For example, battery test systems may be coupled to the battery and configured to provide information related to the health of the battery. In some cases, a tester (e.g., an operator performing the test) may input information specific to the battery undergoing the test. Depending on the configuration, the tester may manually control the battery test system to print a report of the health of the battery, or the battery test system may automatically print the report. Unfortunately, such reports are easily lost and generally lack more than a bare minimum of information. Accordingly, improved battery tester equipment, and improved reports generated by the battery tester equipment, is desired.

SUMMARY

A summary of certain embodiments disclosed herein is set forth below. It should be understood that these aspects are presented merely to provide the reader with a brief summary of certain embodiments and that these aspects are not intended to limit the scope of this disclosure. Indeed, this disclosure may encompass a variety of aspects that may not be set forth below.

The present disclosure relates to a system having a vehicle battery tester configured to test at least one condition of a vehicle battery and to transmit battery condition information relating to the at least one condition of the vehicle battery to a server. The system also includes the server, which is configured to receive the battery condition information from the vehicle battery tester and to transmit, to a consumer, a report generated based at least in part on the battery condition information.

The present disclosure also relates to a method of reporting vehicle battery information to an owner of a vehicle battery. The method includes testing the vehicle battery, via a battery tester, for at least one condition of the vehicle battery, determining a geographic index factor, an environmental index factor, an equipment bias factor, or a combination thereof, and determining an adjusted performance metric for the vehicle battery, where the adjusted performance metric includes an adjustment for the geographic index factor, the environmental index factor, the equipment bias factor, or the combination thereof. The method also includes generating a report of the vehicle battery having at least the adjusted performance metric, transmitting, from the battery tester to a server, the at least one condition of the vehicle battery, the report of the vehicle battery, or both, and transmitting, from the server to a consumer, the report of the vehicle battery.

The present disclosure also relates to a battery report transmission system, including a server configured to receive at least one battery test result of a battery of a consumer, to receive a preferred type of communication of the consumer, to generate a battery test report based at least in part on the at least one battery test result of the battery, and to transmit the battery test report to the consumer via the preferred type of communication of the consumer.

DRAWINGS

Various aspects of this disclosure may be better understood upon reading the following detailed description and upon reference to the drawings in which.

Figure 2:
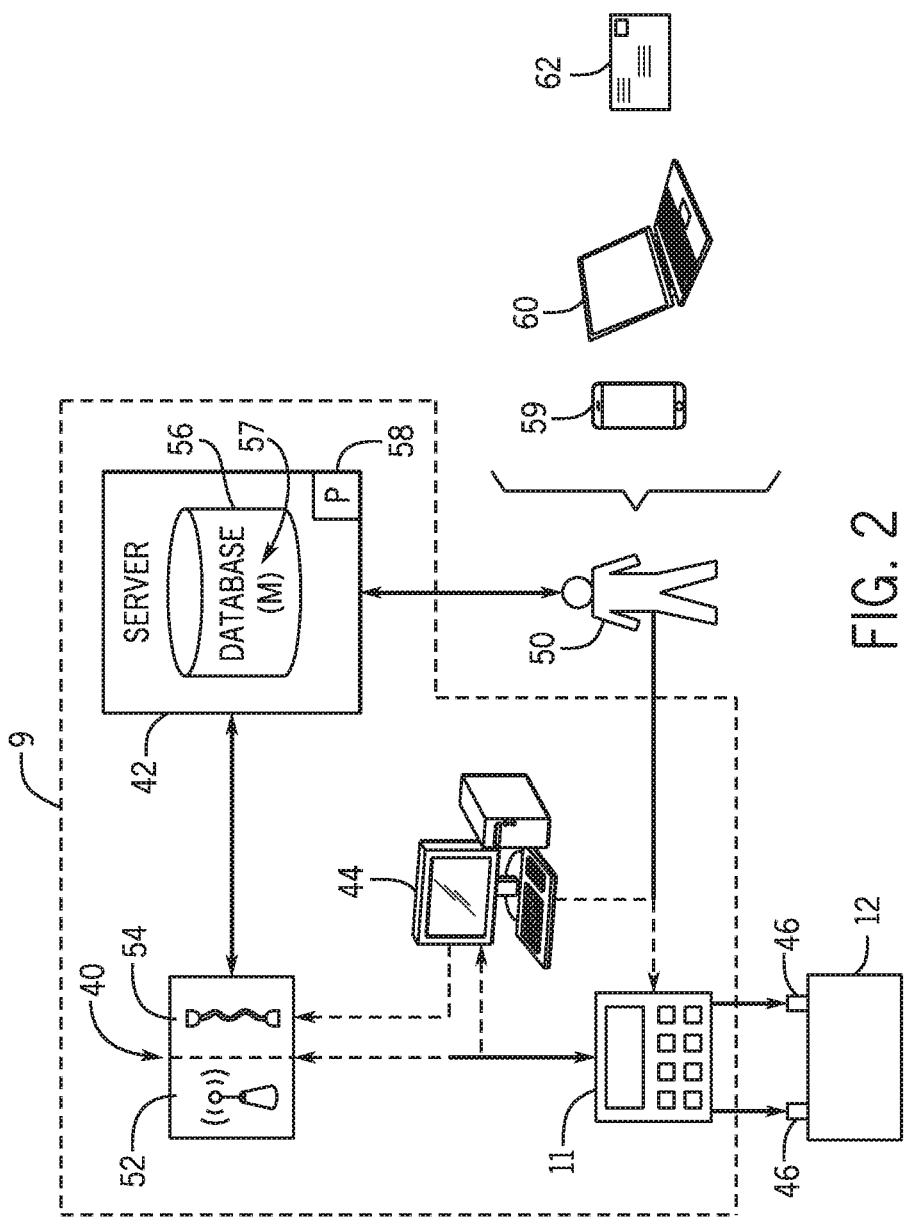
FIG. 2 is a schematic embodiment of a system configured to test a battery and generate a report based on the test of the battery, in accordance with an aspect of the present disclosure.
Figure 4:
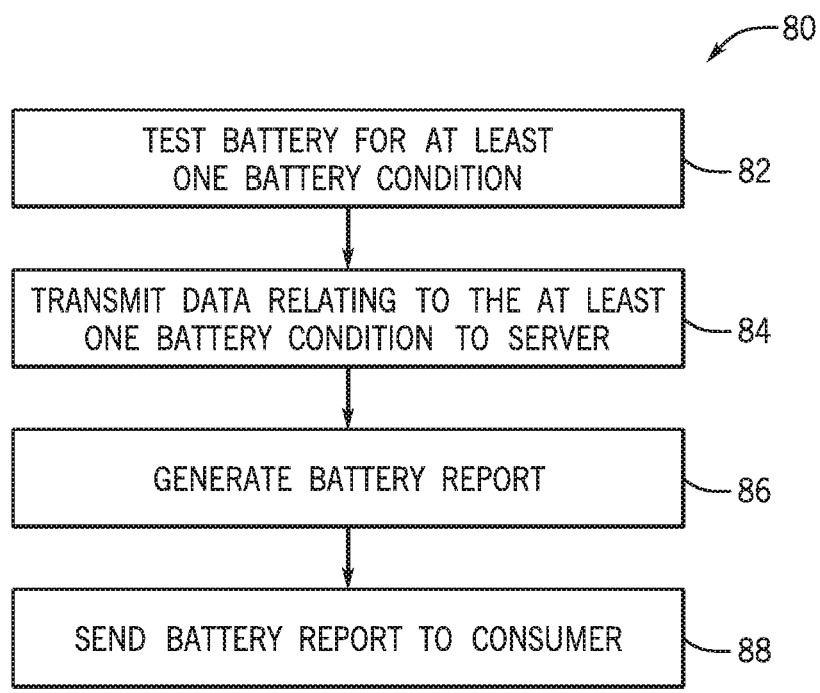
Figure 5:
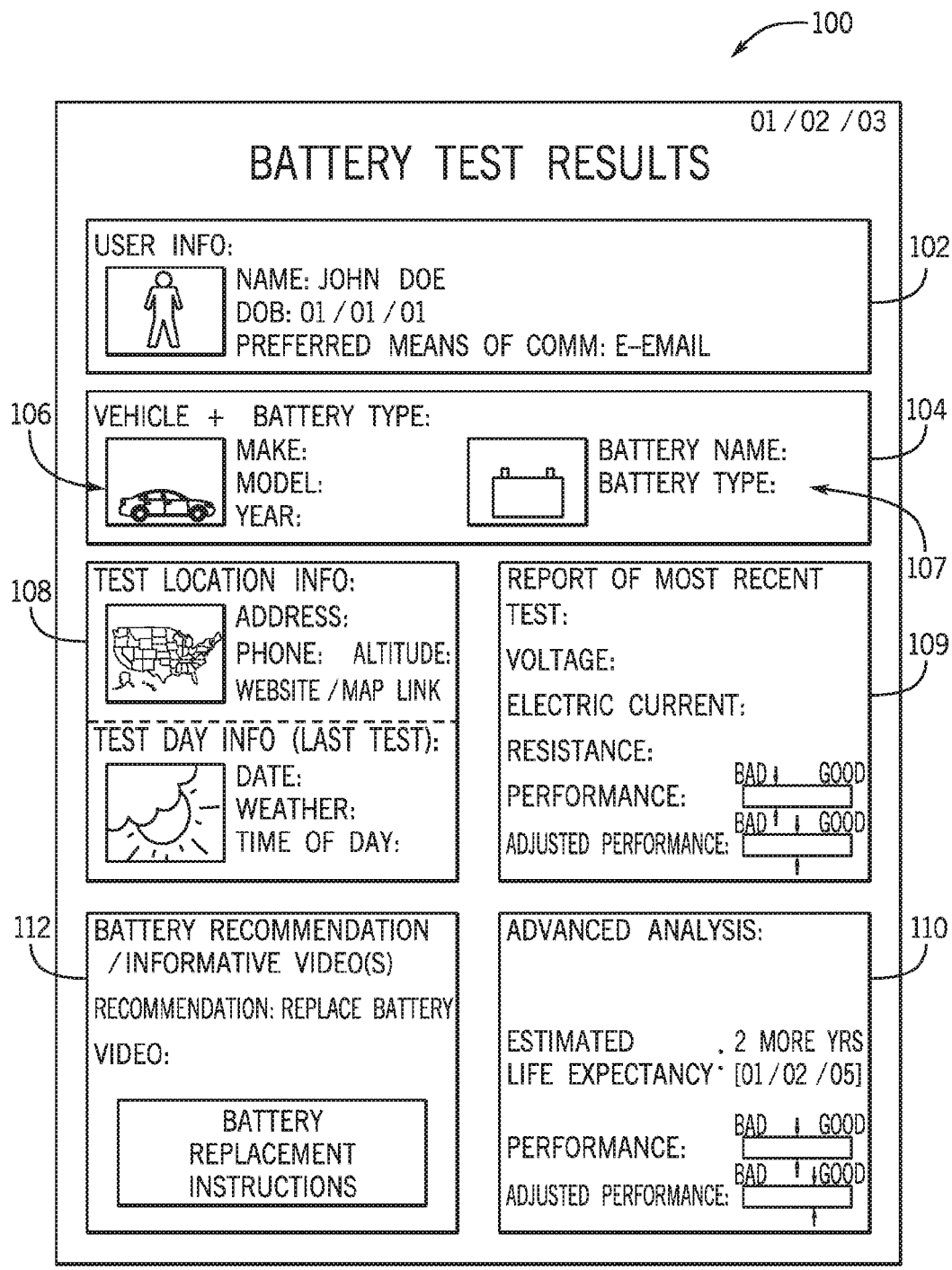

FIG. 4 is a process flow diagram illustrating an embodiment of a method of testing a battery and generating/distributing a report based on the test of the battery (e.g., via the system of FIG. 2), in accordance with an aspect of the present disclosure; and FIG. 5 is a display illustrating an embodiment of the report generated by the system of FIG. 2, in accordance with an aspect of the present disclosure.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

In accordance with embodiments of the present disclosure, a battery test and report system includes a battery tester configured to test batteries. The battery tester may be configured to test any type of battery system, battery module, or battery cell (e.g., lead-acid, lithium-ion [Li-ion]) for at least one battery condition. For example, a consumer may bring a vehicle having a vehicle battery to a participating location (e.g., service center). The vehicle battery may be tested by the battery tester at the participating location (e.g., service center). The battery tester may include a multimeter configured to test an electric current, a voltage, a resistance, a charge rate, a discharge rate, crank amps, cold crank amps, and/or other conditions of the battery. The battery tester may also include an identification reader that identifies the battery being tested. For example, the battery tester may include a scanner that determines a type of the battery (e.g., a primary or secondary battery, a lead-acid battery, a lithium-ion [Li-ion] battery). The identification reader may also identify other parameters of the battery, such as a vehicle in which the battery is disposed, an owner of the battery, and/or other information. Alternatively, battery and/or consumer identification information may be entered into the battery tester, or into a separate component (e.g., such as an on-site computer) manually. In embodiments in which a Li-ion battery is tested (e.g., as described above), the battery tester may be capable of receiving information communicated to the battery tester by the Li-ion battery, in some cases to facilitate a more accurate identification of the battery.

The battery test and report system may also include a communication hub and a server. The battery tester (or an intervening device, such as the on-site computer described above) may communicate test results to the server via the communication hub. For example, the communication hub may include a wired (e.g., Ethernet) connection, a wireless (e.g., Wi-Fi, Bluetooth, cellular connection, or any other wireless communication protocol) connection, or some combination thereof that enables transmission of the test results from the battery tester (or the intervening device, such as the on-site computer) to the server. The server may be a local server or a cloud based server that receives the battery test results from the service center (e.g., from the battery tester or from the on-site computer). The server may then communicate a report having the battery test results to the consumer.

For example, the report referenced above may be generated by the server after the server receives the battery test results from the service center. Additionally or alternatively, some or all of the report may be generated at the service center (e.g., by the battery tester, the on-site computer, some other computing component, or a combination thereof), and communicated to the local or cloud based server. In some embodiments, the battery test results (or report) received by the local or cloud based server may be stored (e.g., saved) in a database. Thus, if one battery is tested multiple times over a course of the battery's life, the multiple test results (or reports) may be saved to the server. In some embodiments, reports may be generated having advanced analytics that include analysis of the multiple test results, as opposed to analysis of a single test result.

Further, the local or cloud based server of the system, or service center equipment (e.g., the battery tester, the on-site computer, or some other component) of the system, may include a geographic indicator, an environmental indicator, or both. The geographic indicator may be a measurement device that determines geographic indexes (e.g., altitude) at the location and/or time of the battery test. The environmental indicator may be a measurement device that determines environmental indexes (e.g., ambient temperature, weather, pollution, or humidity) at the location and/or time of the battery test. The geographic and environmental indexes may be communicated along with the battery test results, and may be incorporated into the battery test report. For example, the conditions of the battery tested by the battery tester may be contextualized with the geographic and/or environmental indexes. Specifically, a performance metric or estimated life span of the battery test report may take geographic and/or environmental indexes at the time and location of the battery test(s) into account.

In accordance with present embodiments, the report may be communicated to the consumer via a computer based message (e.g., e-mail, text message, social media message or post, or some other computer based message), phone call, mail, other communication means, or a combination thereof. Accordingly, the consumer may receive an accurate, personalized report that is easily storable. Further, the consumer may provide a preferred means of communication, such that the report is transmitted to the consumer via the consumer's preferred means of communication. Indeed, in traditional configurations, battery reports may merely be printed at the service center and given to the consumer. Printed battery reports may be easily lost, and may be inaccurate and/or lacking useful information.

Figure 1:
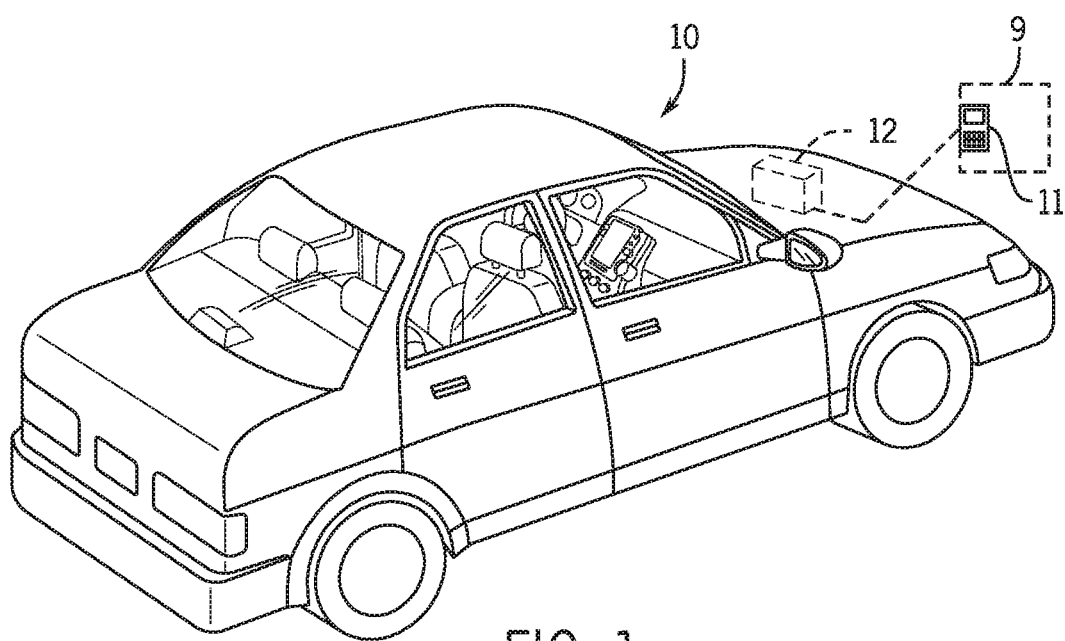
FIG. 1 is a perspective view of a vehicle having a battery system configured in accordance with present embodiments to provide power for various components of the vehicle.

To help illustrate, FIG. 1 is a perspective view of an embodiment of a vehicle 10, which may utilize a regenerative braking system. Although the following discussion is presented in relation to vehicles with regenerative braking systems, the techniques described herein are adaptable to other vehicles that capture/store electrical energy with a battery, which may include electric-powered and gas-powered vehicles.

As discussed above, it would be desirable for a battery 12 to be largely compatible with traditional vehicle designs. Accordingly, the battery 12 may be placed in a location in the vehicle 10 that would generally house a traditional battery system. Furthermore, as will be described in more detail below, the battery 12 may be positioned to facilitate managing temperature of the battery 12. For example, in some embodiments, positioning a battery 12 under the hood of the vehicle 10 may enable an air duct to channel airflow over the battery 12 and cool the battery 12.

In accordance with present embodiments, the battery 12 may be tested by a battery tester 11 of a battery test and report system 9 (e.g., at a participating location or service center). For example, the battery 12 may include any number of battery modules, which may include any number of battery cells. For example, the battery 12 may be a battery system having multiple battery modules, or the battery 12 may be a single battery module having multiple battery cells, or the battery 12 may be a single battery cell. Each cell, module, or system may be individually tested by the battery tester 11. In general, the battery tester 11 tests at least one condition of the battery 12, module, or cell. For example, the battery tester 11 may include a multimeter or other component that measures a voltage, an electric current, a resistance, a charge rate, a discharge rate, or another condition of the battery 12, although the battery tester 11 may test other conditions as well. The battery test and report system 9 may then generate a report based at least in part on the condition(s) tested by the battery tester 11, and communicate the report to a consumer or owner of the battery 12. These and other features will be described in detail with reference to the figures below.

FIG. 2 is a schematic embodiment of the battery test and report system 9. In the illustrated embodiment, the battery test and report system 9 includes the battery tester 11, a communication hub 40, a server 42, and optionally a local computing device 44. In other embodiments, additional or fewer components may be utilized as parts of the battery test and report system 9 (e.g., the local computing device 33 may be eliminated). As previously described, the battery tester 11 is configured to test at least one condition of a battery (e.g., the battery 12 in the illustrated embodiment). The battery tester 11 may couple to one or more terminals 46 of the battery 12, and may measure a voltage, an electric current, a resistance, a charge rate, and/or a discharge rate of the battery 12. In some embodiments, the battery tester 11 may test other conditions of the battery 12 and/or may determine identification parameters of the battery 12. For example, when a consumer 50 brings the battery 12 (or a vehicle in which the battery 12 is disposed) to a service center having the battery tester 11, the battery tester 11 may test the battery 12 and may also determine a type of the battery 12 (e.g., lead-acid, lithium-ion [Li-ion], or any other suitable vehicle battery), a type of the vehicle in which the battery 12 is disposed, and/or may determine identification parameters of the owner 50 (e.g., name, address, or other parameters). Alternatively, the consumer 50 (or a service representative assisting the consumer 50) may enter a subset or all of the identification parameters (e.g., relating to the battery 12, the vehicle, and/or the consumer 50) into the local computing device 44. In some embodiments, the battery tester 11 may be configured such that identification parameters may be manually entered into the battery tester 11.

After completion of the battery test (e.g., by the battery tester 11 and of the battery 12), test results may be communicated to the server 42 by way of the communication hub 40. For example, the communication hub 40 may facilitate transmission of information to the server 42 from the battery tester 11, from the local computing device 44, or both. Thus, the server 42 may receive the battery test results and any identification parameters (e.g., of the battery 12, of the vehicle, and/or of the consumer 50). In general, the communication hub 40 may include a wireless router 52 (e.g., Wi-Fi router) or a wired connection 54 (e.g., Ethernet connection). In general, the battery tester 11 and/or the local computing device 44 may transmit data (e.g., the test results) to the server 42 via any suitable wired or wireless connection. For example, suitable wireless communication may include Wi-Fi, Bluetooth, cellular connection, or any other wireless communication protocol.

In accordance with present embodiments, the server 42 may be a local server or a cloud based server. For example, the server 42 may be maintained on-site (e.g., at the service center in which the battery tester 11 tests the battery 12), or the server 42 may be maintained off-site (e.g., remotely). The server 42 may include a database 56 (e.g., stored in a memory 57 of the server 42) which stores (e.g., saves) the test results received by the server 42 and/or the identification parameters received by the server 42. For example, the database 56 may include a number of user profiles (e.g., a personal profile for each consumer 50, or for the each particular battery 12 being tested). In certain embodiments, the battery 12 may be tested more than once (e.g., at a first maintenance visit and a second maintenance visit). Thus, test results of the battery 12 over time may be stored in a unique battery profile or consumer profile. Over time, results or performance metrics may be generated that track a performance, estimate life span, or other condition of the battery 12 over a life span of the battery 12. Further, it should be noted that each of the multiple battery tests referenced above (e.g., of a single battery) may be administered in different locations (e.g., at various service centers). Each of the multiple battery tests (e.g., of the same battery) may be received by the same server 42, which stores the multiple battery tests (e.g., from multiple service locations) in the same battery profile or consumer profile.

The battery test results may then be transmitted (e.g., communicated) from the server 42 to the consumer 50. In general, a battery test report may be communicated to the consumer 50. The battery test report may be generated by a processor 58 of the server 42 (e.g., after receiving the battery test results and identification information from the battery tester 11 and/or the local computing device 44). For example, the memory 57 of the server 42 may include instructions stored therein that, when executed by the processor 58, cause the processor 58 to carry out certain acts, such as generating the report from the battery test results received by the server 42 and/or sending the report to the consumer 50.

In some embodiments, the battery test report may be generated by the battery tester 11 and/or the local computing device 44 (e.g., where the battery tester 11 and/or the local computing device 44 include similar processors and memories described with reference to the server 42 above), and transmitted to the server 42 such that the server 42 may communicate the report to the consumer 50.

The report, which may be generated by the server 42, the battery tester 11, or the local computing device 44 as set forth above, may be communicated from the server 42 to the consumer 50 via any one of a number of means, including by a mailed letter, an email, a text, Short Message Service (SMS), a social media post or message, or some other communication means. Thus, the consumer 50 may access (e.g., receive) the report via phone 59 (e.g., cell phone), computer 60, or mail 62. It should be noted that the consumer's communication preference may be entered manually into the battery tester 11 or the local computing device 44 at the time of the test. The consumer's preferences may be communicated, along with the battery test results and identification parameters, to the server 42. Accordingly, the server 42 may distribute the battery report via the consumer's preferred form of communication.

Figure 3:
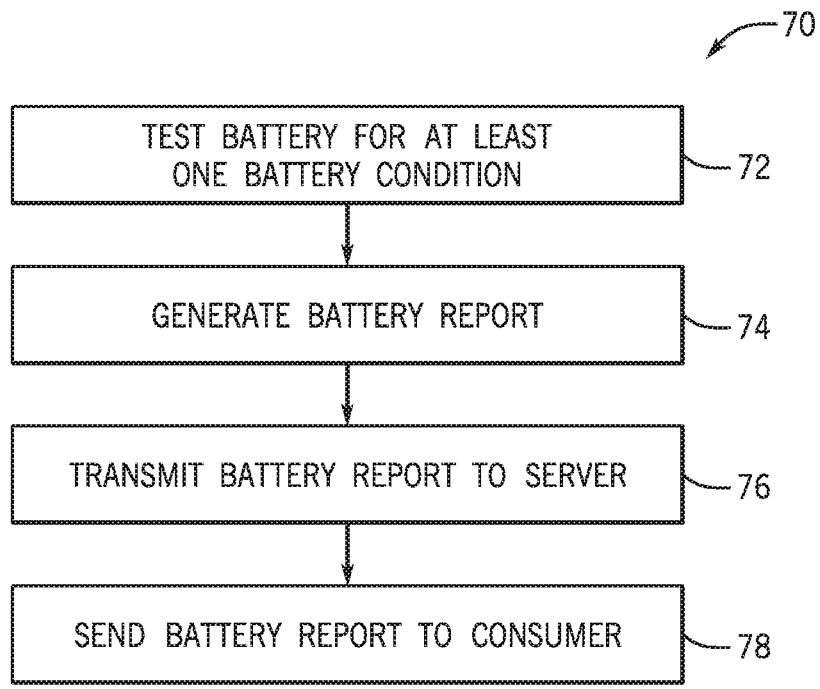
FIG. 3 is a process flow diagram illustrating an embodiment of a method of testing a battery and generating/distributing a report based on the test of the battery (e.g., via the system of FIG. 2), in accordance with an aspect of the present disclosure.

FIG. 3 is a process flow diagram illustrating an embodiment of a method 70 of testing a battery and generating/distributing a report based on the test of the battery, via the system 9 of FIG. 2. For example, in the illustrated embodiment, the method 70 includes testing (block 72) a battery, via a battery tester, for at least one battery condition. As previously described, the battery condition(s) may include an electric current of the battery, a voltage of the batter, a resistance of the battery, a combination thereof, and/or other conditions (e.g., charge rate, discharge rate, etc.). To test operating conditions of the battery (e.g., the voltage, electric current, and/or resistance), the battery tester may couple to terminals or electrodes of the battery. For example, the battery may be disconnected from the load (e.g., the vehicle), and the battery tester may couple to the terminals to test the battery.

Further, the battery may be tested for identification characteristics of the battery or the vehicle in which the battery is disclosed. For example, the battery tester (or another component) may read an identification number or other parameter of the battery and determine the type of battery (e.g., lead-acid, lithium-ion [Li-ion]) and/or the type of vehicle (e.g., make, model, and/or Vehicle Identification Number [VIN]) in which the battery may be disclosed. In some embodiments, identification information of the consumer (e.g., the owner of the vehicle and/or battery) may be determined from the battery test. For example, the battery may be associated with the consumer, and identifying the battery may include identifying the consumer. Alternatively, identification information of the battery, the vehicle, the consumer (e.g., the owner of the vehicle and/or the battery)

may be entered separately (e.g., manually) into the battery tester or into a local computing device (e.g., on-site computer) of a service center in which the battery test is administered.

The method 70 also includes generating (block 74) a battery report based at least in part on the battery condition(s) tested in block 72. For example, the report may be generated on-site (e.g., at the service center or location). The report may take into account the battery test most recently administered. However, in some embodiments, multiple battery test results of a single battery may be saved (e.g., stored). The multiple battery test results may facilitate advanced analysis of a performance of the battery. In accordance with present embodiments, "advanced analytics," as used herein, means an analysis of the battery that includes more than one battery test. For example, the report may include analysis of an expected life span of the battery based on a performance of the battery over the multiple battery tests of the battery administered by the battery tester.

Further, the report may include analysis of how the battery performs (or, put differently, how the battery tests) at various geographic and/or environmental conditions. For example, as previously described, the battery tester or the local computing device may include a geographic indicator, an environmental indicator, or both, and may save geographic indexes (e.g., altitude) and/or environmental indexes (e.g., temperature, humidity, pollution, and/or weather) associated with geographic and environmental conditions during each battery test (e.g., at the time and location of the battery test). Accordingly, the battery test report may include analytics tracking how the battery performs (e.g., during the tests) in different geographic and/or environmental conditions. It should be noted, in accordance with the description below, that the battery test results, reports, indexes, and other information may be stored to, for example, a cloud based server. Thus, battery tests administered in different locations (e.g., at different service centers) may be conglomerated to generate reports having the analytics (including the advanced analytics) described above. Further, testing conditions (e.g., environmental conditions or testing equipment conditions) may be taken into account in an analysis of data available over time. For example, weather conditions that create measurement issues or measurement equipment with established bias may be accounted for to provide more accurate parameter values.

The method 70 also includes transmitting (block 76) the battery report to a server. For example, the server may be a local server maintained on-site (e.g., at the service center), or the server may be a cloud based server maintained remotely. In accordance with the illustrated present embodiment, the battery report is generated prior to transmitting the battery report to the server. However, in other embodiments, and as described in detail below with reference to FIG. 4, data relating to the tested battery conditions may be transmitted directly to the server, and the server itself may generate the battery test report.

In the illustrated embodiment, the server receives the battery test report, which may include basic operating conditions of the battery and/or advanced analytics associated with the battery's performance over time (e.g., including geographic and environmental indexes or factors incorporated therein). The server may also receive identification information of the consumer. For example, as previously described, the consumer's identification information may automatically be detected during the battery test, or the consumer's identification information may be entered manually at the service center (e.g., into the battery tester or into an intervening local computing device). The identification information of the consumer may include the consumer's name, address, e-mail address, phone number, social media account(s), and/or other identification information, such as a preferred means of communication (e.g., e-mail, text message, phone call, mail, or social media). As previously described, any and/or all the information received by the server may be stored or saved to a database maintained on the server or separate from the server. For example, each consumer or battery may include an individual profile or account stored or saved to the database. Thus, information associated with the consumer or battery, as set forth above, may be stored or saved to the consumer's or battery's profile over time.

The method 70 also includes sending or transmitting (block 78) the report to the consumer. For example, the consumer may provide a preferred means of communication during the battery test. The consumer's preferred means of communication may be saved to the consumer (or corresponding battery) profile in the database. The server may access the consumer's preferred means of communication, and may transmit the report over the preferred means of communication. Additionally or alternatively, the server may default to a particular form of communication. If the consumer does not provide a preferred means of communication, the server may utilize one of the available means of communication based on available information and/or default options of the server. For example, the server may include an order of default priority for the means of communication. The server may transmit the report over the highest default priority, assuming enough information is available to do so. For example, e-mail may be the highest default priority. Accordingly, if the consumer's or battery's profile stored to the database of the server includes an e-mail address of the consumer, the report may be transmitted to the consumer via e-mail. If the consumer's or battery's profile stored to the database of the server does not include an e-mail address of the consumer, the report may attempt to transmit the report via the next highest default priority, such as by text message.

FIG. 4 is a process flow diagram illustrating an embodiment of a method 80 of testing a battery and generating/distributing a report based on the test of the battery, via the system 9 of FIG. 2. In the illustrated embodiment of the method 80, block 82 generally corresponds with the block 74 of the method 70. For example, the method 80 includes testing (block 82) the battery for at least one battery condition.

Further, the method 80 includes transmitting (block 84) data relating to the at least one battery condition to a server, and generating (block 86) a battery report (e.g., via the server) from the data transmitted to the server. For example, in the method 70 of FIG. 3, the report may be generated prior to transmittal of the report to the server (e.g., by the battery tester or the on-site computing device). In the illustrated method 80, data indicative of, or relating to, the at least one battery condition tested in block 84 is transmitted to the server (e.g., cloud based server), and the report is generated by the server (or by a computing component associated with or coupled to the server). Depending on the embodiment, computing memory, space, or cost may be saved by generating the report at the server, instead of locally at the service center which tests the battery. For example, as previously described, the server may be cloud based (e.g., off-site), and may include a database having accounts or profiles of various consumers and/or their batteries stored thereto. Each profile or account may include data relating to one or more tests of the corresponding battery. For example, the profile may include three tests of the same battery, where each of the three tests are taken at a different time and/or location. Because the test(s) are transmitted to the server (e.g., cloud based or off-site server) prior to generation of the report, the report may include data from all available information stored to the database. Further, the method 80 includes sending (block 88) the battery report to the consumer. Block 88 of the method 80 generally corresponds with block 78 of the method 70. It should be noted that an on-site server may also generate the report after receiving the battery test results and/or corresponding identification parameters. In other words, generation of the report by the server is not limited to an off-site server (e.g., cloud based server), but may also be carried out by an on-site server.

FIG. 5 is a display showing an embodiment of a battery test report 100 transmitted to the consumer (e.g., by the system 9 of FIG. 2), in accordance with the methods 70, 80 of FIGS. 3 and 4. In the illustrated embodiment, the test report 100 includes a user information box 102. The user information box 102 may include identifying information relating to the consumer or customer that owns the vehicle or battery which the battery test report 100 corresponds with. For example, the user information box 102 may include the user's name, date of birth, and a picture of the user. The user information box 102 may also include a preferred means of communication indicator, which indicates one or more preferred means of communication of the consumer. In some embodiments, the battery test report 100 may be linked to (or include) an interactive user profile, such that the user or consumer may adjust or edit parameters associated with the battery test report 100 or the user profile associated with the battery test report 100. For example, the consumer may edit the preferred means of communication portion of the user information box 102.

The battery test report 100 may also include a vehicle and battery information box 104, which includes information relating to the tested battery and/or the vehicle in which the tested battery is disposed. For example, the vehicle and battery information box 104 may have a first portion 106 directed to vehicle information (e.g., make, model, and/or year), and a second portion 107 directed to battery information (e.g., name and/or type). The first portion 106 directed to vehicle information may include a picture or graphic of the vehicle, and the second portion 107 directed to battery information may include a picture or graphic of the battery.

The battery test report 100 also may include a geographic/environmental information box 108. The geographic/environmental information box 108 may include information about the time and location of the battery test, which may include geographic and/or environmental indexes associated with the time and location of, for example, the most recent battery test. For example, the geographic/environmental information box 108 may include an address, phone number, map, and/or website link associated with the service center that administered the battery test corresponding with the battery test report 100. In some embodiments, the geographic/environmental information box 108 may also include an altitude associated with the service center that administered the battery test. Further, the geographic/environmental information box 108 may include a date on which the test was administered, weather information, and a time of day associated with the battery test. In some embodiments, the geographic/environmental information box 108 may also include pollution and humidity indexes. It should be noted that certain of the information included in the geographic/environmental information box 108 may be utilized (e.g., in conjunction with the at least one battery conditions tested during the battery test) to assess a performance of the tested battery. For example, certain geographic and environmental conditions may cause the battery to perform differently. Accordingly, the geographic and environmental conditions may be considered when determining performance metrics of the battery.

In the illustrated embodiment, the battery test report 100 includes a basic report 109 of the most recently administered battery test. For example, the basic report 109 may include the measured electric current, the measured voltage, and/or the measured resistance of the battery during the battery test. The basic report 109 may also include metrics that take into account geographic and/or environmental indexes (e.g., which may be included in the geographic/environmental information box 108). For example, the basic report 109 may include a performance metric (e.g., raw performance metric) which rates the battery's test performance on a scale, and an adjusted performance metric which rates the battery's test performance in view of geographic/environmental conditions on a scale. The rating in the adjusted performance metric may take into account geographic and/or environmental indexes, and the rating in the performance metric (e.g., raw performance metric) may not take into account geographic and/or environmental indexes. As previously described, the component generating the report 100 (e.g., the on-site or off-site server, the battery tester, or some other computing component) may include a memory and a processor, where the memory stores instructions that, when executed by the processor, cause the processor to carry out certain acts. In some embodiments, formulas that include calculations of the performance metrics of the battery (e.g., which include geographic and/or environmental indexes) may be stored to the memory, and calculated by the processor in view of the battery test results.

In addition to the basic report 109, the battery test report 100 may also include an advanced report 110, which includes advanced analysis of the battery over time. As previously described, the "advanced analysis" referred to herein relates to analysis of two or more battery tests of the same battery, for example from different days and/or in different conditions. As shown, the advanced report 110 may include a performance metric (e.g., raw performance metric) that takes into account not only the most recent battery test, but any preceding battery tests. Further, as shown, the advanced report 110 may include an adjusted performance metric that takes into account the geographic/environmental conditions when rating the performance of the battery over the course of the multiple battery tests included in the advanced analytics. Further still, the advanced report 110 may include an estimated life expectancy (e.g., a number of years left until the battery dies) based on multiple tests. The estimated life expectancy may also show a date on which the battery is expected to die. It should be noted that the estimated life expectancy may also be included in the basic report 109 and calculated from only one battery test (e.g., if only one test has been administered). However, an estimated life expectancy calculated from multiple tests may be more accurate than an estimated life expectancy calculated from a single test. As previously described, the component generating the report 100 (e.g., the on-site or off-site server, the battery tester, or some other computing component) may include a memory and a processor, where the memory stores instructions that, when executed by the processor, cause the processor to carry out certain acts. In some embodiments, formulas that include calculations of the advanced analytics described herein (e.g., incorporating multiple test results) may be stored to the memory, and calculated by the processor in view of the multiple battery test results.

Further, the battery test report 100 may include a battery recommendation box 112. The battery recommendation box 112 may include a recommendation indicator, which may recommend an action to the consumer. For example, the recommendation indicator may recommend that the consumer replace the tested battery. The battery recommendation box 112 may also include a video associated with the battery recommendation or with other information relating to the battery test report 100. For example, if the battery recommendation indicator of the battery recommendation box 112 recommends that the consumer replace the tested battery, the video may include replacement instructions. Other recommendations and/or corresponding videos are possible, such as a recommendation to service the tested battery, a recommendation to re-test the battery, or a recommendation that no additional action is needed. It should be noted that recommendation instructions may be provided in the recommendation box 112 (or elsewhere) without a video.

One or more of the disclosed embodiments, alone or in combination, may provide one or more technical effects useful in the manufacture of batteries, and portions of batteries. In general, embodiments of the present disclosure include a battery tester and report system and method. The system may be incorporated, for example, into a participating location (e.g., service center) where a consumer may bring the consumer's vehicle to have the vehicle's battery tested. The system includes a battery tester which tests the vehicle battery, and a server which receives the test results. The battery tester, the server, or an intervening component may format the results as a battery report. The report may be communicated to the consumer over the consumer's preferred means of communication. Thus, the report may be easily received and saved by the consumer. Further, servicing time or consumer wait time may be reduced. Further still, by storing test results (e.g., to the server), reports may include data and corresponding advanced analytics from multiple tests of the battery over time. Thus, presently disclosed embodiments may facilitate more accurate results, more useful information, and ease of access to information. The technical effects and technical problems in the specification are exemplary and are not limiting. It should be noted that the embodiments described in the specification may have other technical effects and can solve other technical problems.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure

The invention claimed is:

1. A system, comprising:
a first vehicle battery tester at a first service location, wherein the first vehicle battery tester is configured to test at least one condition of a vehicle battery and to transmit a first data set indicative of battery condition information relating to the at least one condition of the vehicle battery to a server;
a second vehicle battery tester at a second service location different than the first service location, wherein the second vehicle battery tester is configured to test the at least one condition of the vehicle battery and to transmit a second data set indicative of the battery condition information to the server; and
the server, wherein the server is configured to receive the first data set indicative of the battery condition information from the first vehicle battery tester and the second data set indicative of the battery condition information from the second vehicle battery tester, and to transmit, to a consumer of the vehicle battery, a report generated based at least in part on the first data set and the second data set.

2. The system of claim 1, comprising a database configured to store the first data set and the second data set therein.

3. The system of claim 2, wherein the test by the first vehicle battery tester and the test by the second vehicle battery tester are administered at different times, and wherein the report includes advanced analytics based at least in part on both the first data set and the second data set.

4. The system of claim 1, comprising a geographic indicator configured to determine a geographic index of an area in which the vehicle battery is tested by the first vehicle battery tester, an environmental indicator configured to determine an environmental index of the area in which the vehicle battery is tested by the first vehicle battery tester, or a combination thereof, wherein the server contextualizes the first data set indicative of the battery condition information in view of the geographic index, the environmental index, or both to generate the report.

5. The system of claim 1, comprising a communication hub configured to enable transmission of the first data set from the first vehicle battery tester to the server.

6. The system of claim 5, wherein the first vehicle battery tester and the second vehicle battery tester are configured to test a voltage of the vehicle battery, an electric current of the vehicle battery, a resistance of the vehicle battery, or a combination thereof.

7. The system of claim 5, wherein the communication hub comprises a Wi-Fi router or a cellular connection.

8. The system of claim 1, wherein the server is a cloud based server.

9. The system of claim 1, wherein the server is configured to transmit the report via an e-mail to the consumer, via a text, Short Message Service (SMS), or other phone-based message to the consumer, via a social media post or message to the consumer, or via a combination thereof.

10. The system of claim 1, wherein the first vehicle battery tester or a data entry device of the system is configured to receive contact information of the consumer to facilitate transmittal of the report from the server to the consumer.

11. A method of reporting vehicle battery information to an owner of a vehicle battery, comprising:
testing the vehicle battery, via a first battery tester at a first service location, for at least one condition of the vehicle battery;
transmitting a first data set indicative of battery condition information relating to the at least one condition of the vehicle battery from the first battery tester to a server;
testing the vehicle battery, via a second battery tester at a second service location, for the at least one condition of the vehicle battery;
transmitting a second data set indicative of the battery condition information relating to the at least one condition of the vehicle battery from the second battery tester to the server;
generating, at the server and based on the first data set received from the first battery tester and the second data set received from the second battery tester, a report of a condition of the vehicle battery; and transmitting, from the server to a consumer, the report of the condition of the vehicle battery.

12. The method of claim 11, wherein the server is a cloud based server.

13. The method of claim 11, comprising testing the vehicle battery with the first battery tester at a first time, testing the vehicle battery with the second battery tester at a second time different than the first time, and including in the report at least one advanced analytic reflective of a change to the condition of the vehicle battery from the first time to the second time.

14. A battery report transmission system, comprising:
a server having a processor configured to:
receive a first battery test result of a vehicle battery of a consumer from a first battery tester of a first service location;
receive a second battery test result of the vehicle battery of the consumer from a second battery tester of a second service location different than the first service location;
receive data indicative of a selection of a preferred type of communication of the consumer;
generate a battery test report based at least in part on the first battery test result of the vehicle battery and the second battery test result of the vehicle battery; and
automatically transmit the battery test report to the consumer via the preferred type of communication of the consumer.

15. The battery report transmission system of claim 14, wherein the preferred type of communication of the consumer comprises an automated computer based message.

16. The battery report transmission system of claim 14, wherein the server comprises a memory configured to store the first battery test result and the second battery test result therein.

17. The battery report transmission system of claim 16, wherein the server is configured to generate at least one advanced analytic based on the first battery test result and the second battery test result.

* * * * *